(12) United States Patent
Habenschaden

(10) Patent No.: US 10,295,047 B2
(45) Date of Patent: May 21, 2019

(54) PRINTED CIRCUIT BOARD FOR ELECTRONICALLY FUNCTION CONTROL FOR A VEHICLE

(71) Applicant: ZF Friedrichshafen AG, Friedrichshafen (DE)

(72) Inventor: Josef Habenschaden, Kohlberg (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 432 days.

(21) Appl. No.: 15/096,493

(22) Filed: Apr. 12, 2016

(65) Prior Publication Data
US 2016/0305541 A1 Oct. 20, 2016

(30) Foreign Application Priority Data
Apr. 14, 2015 (DE) .......... 10 2015 206 616

(51) Int. Cl.
*F16H 61/00* (2006.01)
*H05K 5/00* (2006.01)
(52) U.S. Cl.
CPC ....... *F16H 61/0006* (2013.01); *H05K 5/0082* (2013.01)
(58) Field of Classification Search
CPC .......................... F16H 61/0006; H05K 5/0082
See application file for complete search history.

(56) References Cited

U.S. PATENT DOCUMENTS

| | | | | |
|---|---|---|---|---|
| 2002/0166409 A1* | 11/2002 | True | ........... | F16H 57/0412 74/606 R |
| 2004/0261570 A1* | 12/2004 | Suzuki | ........... | F16H 61/0006 74/606 R |
| 2011/0248200 A1* | 10/2011 | Fathauer | ........... | H05K 1/119 251/129.15 |
| 2013/0069320 A1* | 3/2013 | Yanagisawa | ........... | H05K 5/0056 277/628 |
| 2013/0072040 A1* | 3/2013 | Ohhashi | ........... | H01R 13/5202 439/76.1 |
| 2014/0080329 A1* | 3/2014 | Yamanaka | ........... | H05K 5/0069 439/76.1 |
| 2014/0334104 A1* | 11/2014 | Yang | ........... | H05K 5/0047 361/709 |
| 2015/0009629 A1* | 1/2015 | Moon | ........... | H05K 5/0034 361/709 |
| 2015/0250072 A1* | 9/2015 | Ichikawa | ........... | H05K 5/063 439/587 |
| 2016/0135317 A1* | 5/2016 | Lee | ........... | H01R 13/5202 361/752 |

(Continued)

*Primary Examiner* — David M Fenstermacher
(74) *Attorney, Agent, or Firm* — Brinks Gilson & Lione

(57) ABSTRACT

A printed circuit board for electronic function control for a vehicle is created, comprising at least one actuator connection, of which a first part is attached to the printed circuit board and a second part extends away from the printed circuit board, and a connecting element, of which a first part is attached to the printed circuit board and a second part extends away from the printed circuit board, characterized in that the printed circuit board is coated, such that the printed circuit board and the first parts of the at least one actuator connection and the connecting element are protected, such that a seal against external effects acting on the printed circuit board is obtained. Furthermore, a system having a printed circuit board according to the disclosure is created.

18 Claims, 1 Drawing Sheet

(56) References Cited

U.S. PATENT DOCUMENTS

| | | | |
|---|---|---|---|
| 2016/0198570 A1* | 7/2016 | Yonezawa | C08L 63/00 |
| | | | 428/209 |
| 2016/0295721 A1* | 10/2016 | Furudate | B60R 16/02 |
| 2017/0006711 A1* | 1/2017 | Liskow | H05K 3/3421 |
| 2017/0009771 A1* | 1/2017 | Reul | F04D 13/0606 |
| 2017/0171995 A1* | 6/2017 | Lee | H05K 5/0056 |
| 2017/0264038 A1* | 9/2017 | Ozawa | F16K 31/0675 |
| 2017/0290178 A1* | 10/2017 | Albert | H05K 5/0069 |
| 2017/0314669 A1* | 11/2017 | Paris | F16H 57/0413 |
| 2018/0035567 A1* | 2/2018 | Polak | H05K 5/0017 |
| 2018/0101703 A1* | 4/2018 | Marozau | G06K 7/042 |
| 2018/0220539 A1* | 8/2018 | Kaneko | H05K 5/0017 |

\* cited by examiner

PRINTED CIRCUIT BOARD FOR ELECTRONICALLY FUNCTION CONTROL FOR A VEHICLE

PRIORITY STATEMENT

This application claims the benefit of German Patent Application DE 10 2015 206 616.9, filed Apr. 14, 2015, and incorporates the German Patent Application by reference herein in its entirety.

FIELD

The present disclosure relates to a printed circuit board for electronic function control for a vehicle according to the preamble of claim 1, and a system according to the preamble of claim 7.

BACKGROUND

The control of functions of a vehicle, e.g. the control of automatic transmissions, lamp functions, motor functions, etc. occurs increasingly more frequently via control devices, e.g. electronic control devices such as electronic transmission controls and similar so-called ECUs (electronic control unit). Control units present in current vehicles are connected to one another via different system busses such as CAN busses, Ethernet, etc. to form a so-called vehicle bus system. The control devices are disposed on printed circuit boards, which also have other interfaces to actuators or sensors, for example. This enables a control of the actual state of the system, such that in the case of a deviation from the target state, a control or regulation of the engine, solenoid valves, etc. can be initiated by means of corresponding actuators, in order to obtain a correction of the system state. The control of the system state occurs by means of sensors, for example.

Integrated control devices, as well as add-on and removable control devices are known from the prior art. Add-on and removable control devices have the advantage that, due to the limited number of components for the control device itself, they can be developed and produced relatively inexpensively. On the other hand, additional components are needed in order to enable a control of a vehicle, for example. These components are cables, wiring harnesses, or plug connections, for example. The numerous such additional individual components increase the chance of individual components malfunctioning, or become damaged during maintenance or repair work. Thus, through additional individual components, not only is more space needed, but also, there may be a drop in quality as a result of the increased probability of malfunctions. Moreover, there are higher costs for the overall device as a result of the necessity of purchasing more individual components. These problems are resolved in part through integrated control devices. With these control devices, as few components as possible are added on, such that a high level of coordination of the individual components to one another is possible, by means of which a high level of integration density is obtained.

Printed circuit boards for electronic function control for a vehicle must fulfill different criteria regarding their robustness. By way of example, it may be the case that the printed circuit boards, having the electronics located thereon, such as a control device, are placed in the hydraulic module of the vehicle, and are thus exposed, for example, to transmission fluid or hot (transmission or motor) oil. Because of this, it is necessary to protect the sensitive electronics on the printed circuit boards. In order to protect these electronics, printed circuit boards are encapsulated, such that the connections, such as the actuator connections and on-board electrical system plugs are protected from external effects. This is obtained in that plug connections or plugs and wiring harnesses between the printed circuit boards and the actuators and the on-board electrical system or bus system are attached to the printed circuit boards, which prevent fluids from coming in contact with the printed circuit boards and thus the electronics. The disadvantage with this is that plug connections or complex wiring harnesses require a lot of space, and furthermore, the system architecture is complex, expensive and prone to error.

For this reason, it is one objective of this disclosure to provide a printed circuit board for electronic function control for a vehicle, which overcomes the known disadvantages. Preferably, the function control is the transmission control of the vehicle.

This object is achieved through the features of claims 1 and 7. Advantageous designs are the subject matter of the dependent Claims.

SUMMARY

A printed circuit board for the electronic control for a vehicle is proposed according to the disclosure, onto which a connecting element is attached for connecting to the vehicle bus system, which is also referred to as an on-board electronics system plug connector. A first part of the connecting element is attached to the printed circuit board, and a second part extends away from the printed circuit board, in order to be connected to the on-board electronics system connector. In addition, the printed circuit board has at least one actuator connection, of which a first part is attached to the printed circuit board, and a second part extends away from the printed circuit board, in order to be connected to a corresponding actuator. An actuator connection can also be referred to as a connecting lug. The number of actuators, and thus the number of actuator connections, depends on which function, or functions, in the vehicle are to be controlled or regulated.

In order to create a compact, simple, robust and inexpensive printed circuit board for the electric control of vehicle functions, comprising an on-board electronics system connector and actuator connections, the printed circuit board, in particular having the first parts of the on-board electronics system connector and the actuator connections, is coated in accordance with the disclosure, such that these components are protected such that a seal against external effects on the printed circuit board is obtained. More precisely, each first part of an actuator connection on the printed circuit board is encased in the coating.

This means that the coating is carried out such that a complete encapsulation of the printed circuit board, with all of the components disposed on the printed circuit board, such as electronic components, e.g. a control device, etc. as well as the first parts of the actuator connections and the on-board electronics system connector, is obtained. The connection regions of the actuator connectors and the on-board electronics system connector, which are not coated, because they extend from the printed circuit board outward in order to be connected to the actuators and the on-board electronics system connector, can thus be connected directly to the associated external connection components such as the on-board electronics system connector or actuators, thus without further encapsulating measures.

A coating occurs, for example, by means of an injection molding process, but is not limited thereto. Any suitable process may be used, as long as the complete encapsulation of the printed circuit board and the corresponding connections required according to the disclosure can be implemented by this means.

An encapsulation of this type has the advantage over the prior art that no additional plug-in connections or wiring harnesses are needed in order to connect the printed circuit board to a hydraulic module, for example. By coating the printed circuit board with a material that is suited to the respective application, the sensitive components, such as electronics, that are present on the printed circuit board are protected, such that no additional protective measures are needed for connecting them to external connections, such as the vehicle bus or actuators.

By means of the proposed coating of the printed circuit board, the number of electrical and mechanical interfaces is reduced, i.e. the number of plug connectors and wiring harnesses can be reduced, or they can be entirely eliminated. At the same time, the construction of the printed circuit board, and thus the connection of the electronic function control, preferably the transmission control, to actuators, e.g. for monitoring and controlling or regulating a hydraulic system, is simplified. Furthermore, the construction of the printed circuit board, or the overall system, is more compact, i.e. space saving, because substantially fewer individual connections are needed.

By eliminating additional plug connections, or wiring harnesses, the high costs and risks associated with plug connectors, particularly regarding malfunction probabilities, can be avoided.

It is further provided in the scope of the disclosure that the printed circuit board according to the disclosure also comprises at least one sensor connection, of which a first part is attached to the printed circuit board, and a second part extends away from the printed circuit board, wherein the coating of the printed circuit board also encompasses the first part of the at least one sensor connection. It is further provided that the printed circuit board according to the disclosure comprises at least one connecting lug, of which a first part is attached to the printed circuit board, and a second part extends away from the printed circuit board, wherein the coating of the printed circuit board also encompasses the first part of the at least one connecting lug. More precisely, each first part of a sensor connection or a connecting lug present on the printed circuit board is coated. Sensors are an important means for monitoring vehicle functions. Connecting lugs are needed for attaching the printed circuit board with the control device functions to corresponding modules in the vehicle that are to be controlled, e.g. a hydraulic module. An integration of sensors and connecting lugs in the printed circuit board according to the disclosure increases the compactness of the system and leads to an increased robustness, because even fewer connecting elements, such as connectors or wiring harnesses, are needed between the printed circuit board and the external components. This results, in turn, in reduced costs.

The attachment of the first part of the respective components, e.g. the actuator connections, the sensor connections, and the on-board electronics system connector, to the printed circuit board occurs preferably by means of injection, welding or soldering. As a result, a permanent connection is obtained between the components and the printed circuit board. The advantage is that a large variety of methods, not explained herein, can be used for attaching the first parts to the printed circuit board, because the printed circuit board is protected by the coating, such that no interaction with external effects can affect the connection of the printed circuit board to the components connected thereto. Any method that is suited for producing a permanent connection between the printed circuit board and the connections may be used.

Furthermore, it is provided according to the disclosure that, in addition, the second part of the connecting element is coated such that a seal against external effects acting on the printed circuit board is obtained. As a result of the complete coating of the pins of the on-board electronics system connector, the use of additional wiring for connecting the on-board electronics system connector to the vehicle bus system can be avoided. This leads to a further simplification and robustness of the overall system, and reduces costs.

Furthermore, it is provided that the printed circuit board is coated such that a hermetic encapsulation of the printed circuit board with the first parts attached to the printed circuit board is obtained. This means that a sealing against gas and fluids of all types is obtained. This has the advantage that the printed circuit board with the electronics components attached thereto, for controlling vehicle functions, as well as other connections, can be placed directly in the transmission or the engine of the vehicle, for example, because an encapsulation against hot fluids, such as transmission fluid or motor oil, is obtained. In this manner, the entire system is simplified, in turn, because error-prone, long, and space consuming connecting wires can be eliminated.

A system is provided in the scope of the present disclosure that furthermore comprises the printed circuit board according to the disclosure, as well as a function control element connected to the printed circuit board, in particular a hydraulic module, with actuators. Actuators serve as the control for function control elements, e.g. the hydraulic module. The advantage with the system is that the second part of each of the at least one actuator connections of the printed circuit board is connected directly to the corresponding actuator of the function control element, in particular the hydraulic module.

It is furthermore provided that a second part of each of the at least one sensor connections, as long as they are present on the printed circuit board, is also connected directly to the corresponding sensor of the function control element, in particular the hydraulic module. Moreover, it is likewise provided that the second part of the at least one connecting lug of the printed circuit board is directly connected to the corresponding connection part of the function control element, in particular the hydraulic module.

As a result of this design of the system, an overall system for electronic function control can be provided for vehicles, which does not require any further connections such as wire connections or wiring harnesses in order to connect the printed circuit board to the corresponding function control elements, e.g. a hydraulic module having hydraulic valves or sensors. The stability of the attachment of the printed circuit board to a function control element is ensured by the connecting lug, and, at the same time, is significantly more stable as a result of the direct connection. As a result, the robustness of the system is significantly increased. Moreover, a substantially more compact and less expensive system can be created. In addition, safety requirements can be more easily fulfilled, because the system is able to function with fewer individual components.

It is furthermore provided that the connection of the second part to the corresponding connection of the function control element, in particular the hydraulic module, can be obtained by means of injection, screwing, soldering or welding. It is ensured by these methods for attachment that a permanent connection between the printed circuit board and function control elements is obtained. Other methods for attachment can also be used thereby, because there are practically no limitations to be accounted for regarding the effects of external conditions, because the printed circuit board is coated. The only thing that has to be taken into account is that a method is used that is suited for producing a permanent connection between the second parts and the connections of the function control elements.

Further features and advantages of the disclosure can be derived from the following description of exemplary embodiments of the disclosure, based on the figures in the drawings, which show details according to the disclosure, and from the claims. The individual features can be realized in and of themselves, or in numerous combinations in a variation of the disclosure.

BRIEF DESCRIPTION OF THE DRAWINGS

Preferred embodiments of the disclosure shall be explained in greater detail below, based on the attached drawings. Therein.

DETAILED DESCRIPTION OF EXAMPLE EMBODIMENTS

In the following description of the figures, identical elements or functions are provided with identical reference symbols.

Figure 1:
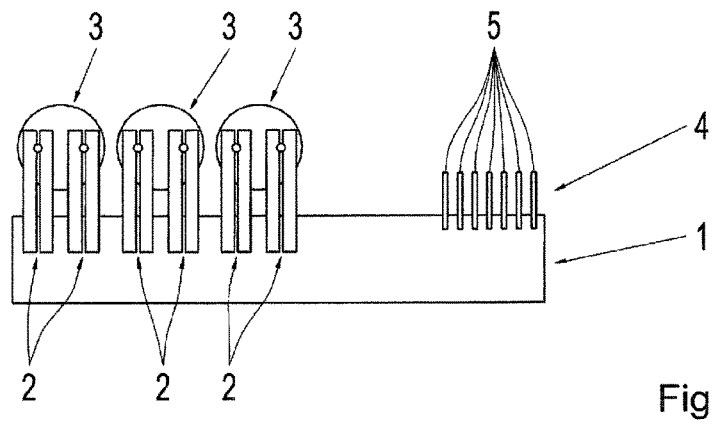
FIG. 1 shows a top view of a printed circuit board for electronic function control for a vehicle according to the prior art.

FIG. 1 shows a top view of a printed circuit board 1, having electronic components (not shown) for the electronic function control, in this case the transmission control, for a vehicle. Actuator connections 2 as well as pins 5 for connecting an on-board electronics system connector 4 are disposed on the printed circuit board 1 according to the prior art. Furthermore, external actuators 3, in this case hydraulic valves, connected by means of the actuator connections 2, are also shown.

Figure 2:
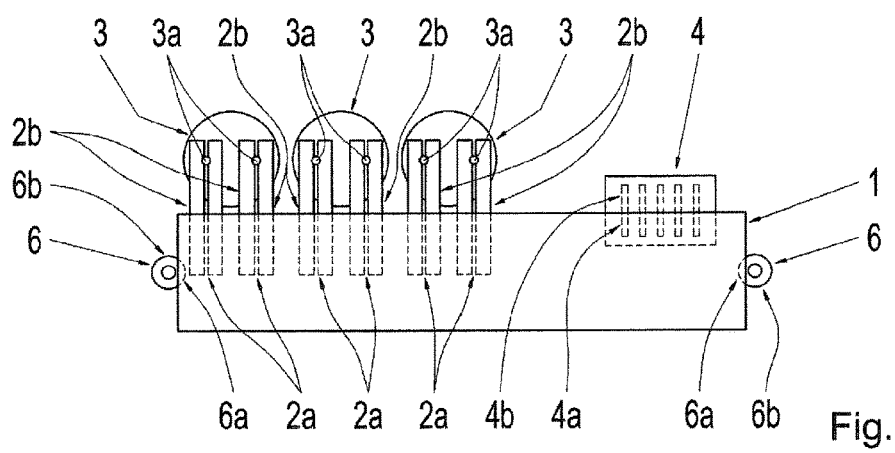
FIG. 2 shows a top view of a coated printed circuit board for electronic transmission control for a vehicle according to one possible embodiment of the disclosure.

FIG. 2 shows an exemplary view of a coated printed circuit board, having electronic components (not shown) for electronic function control, in this case a transmission control, for a vehicle, with actuator connections 2 disposed on the printed circuit board 1. The actuator connections 2 have two parts 2a, 2b. The first part 2a is the part connected to the printed circuit board, which is coated according to the disclosure. This part is depicted by a broken line in FIG. 2, because it is covered by the coating. The second part 2b is not coated, and serves as the connection for external actuators 3, which are hydraulic valves in this case, to the printed circuit board 1. Furthermore, a completed, coated on-board electronics system connector 4 is shown, meaning that here, both the first part 4a as well as the second part 4b of the on-board electronics system connector are coated. Moreover, connecting lugs, or attachment lungs 6 for connecting the printed circuit board 1 to another module, such as a hydraulic module, for example, are also shown. The connecting lugs 6 likewise have, in each case, a first part 6a, which is connected to the printed circuit board, and a second part 6b, which serves for the connection to another module such as a hydraulic module. The first part 6a is, in turn, depicted in FIG. 2 with a broken line, because it is covered by the coating.

Figure 3:
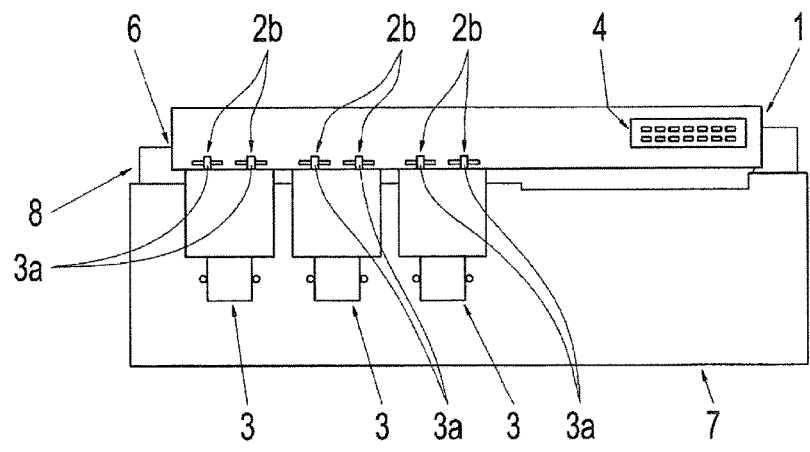
FIG. 3 shows a view of a coated circuit board for electronic transmission control of a vehicle connected to a hydraulic module, in accordance with one possible embodiment of the disclosure.

FIG. 3 shows an exemplary view of a coated printed circuit board like that in FIG. 2, which is connected with an external module, in this case a hydraulic module 7, to form a system. The direct connection between the printed circuit board 1 according to the disclosure and the module 7 is shown here, i.e. the connection without additional wiring or wiring harnesses. More precisely, it is shown that the second part 2b of the actuator connection 2 is connected directly to the connections 3a of the actuators, in this case hydraulic valves. It is also shown that the connection of the printed circuit board 1 to the hydraulic module 7 also occurs via the connecting lug 6 of the printed circuit board, more precisely, via the second part 6b of the connecting lug, and the connection 8 of the hydraulic module 7.

The coated printed circuit board according to the present disclosure is preferably used for add-on control devices, but can, for example, also be incorporated directly, together with a hydraulic module, in the transmission. The advantage of the coated printed circuit board according to the disclosure is that, through the encapsulation of the printed circuit board, and thus the connecting elements, no further mechanically or electrically protected components, such as a wiring harness or an encapsulated plug are needed externally, on either the part of the printed circuit board, or for the actuator system and/or sensor system. This enables a very compact construction, such that space is saved, and malfunctioning components due to a wiring harness, for example, are eliminated. Furthermore, this is an inexpensive solution, because no further, potentially expensive and complex connecting parts are needed.

REFERENCE SYMBOLS 1 printed circuit board
2 actuator connection
2a first part of the actuator connection
2b second part of the actuator connection
3 actuators
3a actuator connections
4 on-board electronics system connector
4a first part of the on-board electronics system connector
4b second part of the on-board electronics system connector
5 connector pins
6 connecting lug
6a first part of the connecting lug
6b second part of the connecting lug
7 hydraulic module
8 hydraulic module connection

The invention claimed is:

1. A printed circuit board for electronic function control for a vehicle, comprising:
   at least one actuator connection, of which a first part of the at least one actuator connection is attached to the printed circuit board and a second part of the at least one actuator connection extends away from the printed circuit board, and
   a connecting element, of which a first part of the connecting element is attached to the printed circuit board and a second part of the connecting element extends away from the printed circuit board, wherein the printed circuit board includes a coating layer, the coating layer contacts an entire exposed surface of the printed circuit board, the coating layer contacts an entire exposed surface of the first part of the at least one actuator connection, and the coating layer contacts an entire exposed surface of the first part of the connecting element, such that the printed circuit board and the first parts of the at least one actuator connection and the connecting element are protected, such that a seal against external effects acting on the printed circuit board is obtained.

2. The printed circuit board according to claim 1, further comprising at least one sensor connection, of which a first part of the at least one sensor connection is attached to the printed circuit board and a second part of the at least one sensor connection extends away from the printed circuit board,
wherein the first part of the at least one sensor connection is in contact with the coating layer.

3. The printed circuit board according to claim 1, further comprising at least one connecting lug, of which a first part of the at least one connecting lug is attached to the printed circuit board and a second part of the at least one connecting lug extends away from the printed circuit board,
wherein the first part of the at least one connecting lug is in contact with the coating layer.

4. The printed circuit board according to claim 1, wherein the attachment of the first parts of the at least one actuator connection and the connecting element to the printed circuit board are obtained by means of injection, welding or soldering.

5. The printed circuit board according to claim 1, wherein the second part of the connecting element is in contact with the coating layer.

6. The printed circuit board according to claim 1, wherein the coating layer causes a hermetic encapsulation of the printed circuit board, including the first parts of the at least one actuator connection and the connecting element.

7. A system, comprising:
a printed circuit board comprising:
at least one actuator connection, of which a first part of the at least one actuator connection is attached to the printed circuit board and a second part of the at least one actuator connection extends away from the printed circuit board, and
a connecting element, of which a first part of the connecting element is attached to the printed circuit board and a second part of the connecting element extends away from the printed circuit board,
wherein the printed circuit board includes a coating layer, the coating layer contacts an entire exposed surface of the printed circuit board, the coating layer contacts an entire exposed surface of the first part of the at least one actuator connection, and the coating layer contacts an entire exposed surface of the first part of the connecting element, such that the printed circuit board and the first parts of the at least one actuator connection and the connecting element are protected, such that a seal against external effects acting on the printed circuit board is obtained; and
a function control element connected to the printed circuit board, the function control element having actuators,
wherein the second part of each of the at least one actuator connections of the printed circuit board is connected directly to the corresponding actuator of the function control element.

8. The system according to claim 7, wherein the function control element comprises sensors,
wherein the printed circuit board further comprises at least one sensor connection, of which a first part of the at least one sensor connection is attached to the printed circuit board and a second part of the at least one sensor connection extends away from the printed circuit board, wherein the first part of the at least one sensor connection is in contact with the coating layer;
wherein the second region of each of the at least one sensor connection of the printed circuit board is connected directly to the corresponding sensor of the function control element.

9. The system according to claim 7, wherein the function control element comprises connecting regions,
wherein the printed circuit board further comprising at least one connecting lug, of which a first part of the at least one connecting lug is attached to the printed circuit board and a second part of the at least one connecting lug extends away from the printed circuit board, wherein the first part of the at least one connecting lug is in contact with the coating layer;
wherein the second part of the at least one connecting lug of the printed circuit board is connected directly to the corresponding connecting region of the function control element.

10. The system according to claim 7, wherein the connection of the second parts of each of the at least one actuator connections of the printed circuit board to the corresponding connection of the function control element is obtained by means of injection, screwing, soldering, or welding.

11. The printed circuit board according to claim 3, wherein the attachment of the first part of the at least one connecting lug to the printed circuit board is obtained by means of injection, welding or soldering.

12. The printed circuit board according to claim 3, wherein the printed circuit board is coated, such that a hermetic encapsulation of the printed circuit board is obtained, including the first part of the at least one connecting lug.

13. The printed circuit board according to claim 5, wherein the coating layer causes a hermetic encapsulation of the printed circuit board, including the second part of the connecting element.

14. The printed circuit board according to claim 1, wherein the coating layer occurs by an injection molding process.

15. The printed circuit board according to claim 1, wherein the second parts of the at least one actuator connection and the connecting element are not in contact with the coating layer.

16. The system according to claim 7, wherein the function control element is a hydraulic module.

17. The system according to claim 9, wherein the connection of the second part of the at least one connecting lug of the printed circuit board to the corresponding connecting region of the function control element is obtained by means of injection, screwing, soldering, or welding.

18. A transmission for a vehicle comprising:
a transmission casing; and
a printed circuit board positioned within the transmission casing, the printed circuit board comprising:
at least one actuator connection, of which a first part of the at least one actuator connection is attached to the printed circuit board and a second part of the at least one actuator connection extends away from the printed circuit board, and a connecting element, of which a first part of the connecting element is attached to the printed circuit board and a second part of the connecting element extends away from the printed circuit board, wherein the printed circuit board includes a coating layer, the coating layer contacts an entire exposed surface of the printed circuit board, the coating layer contacts an entire exposed surface of the first part of the at least one actuator connection, and the coating layer contacts an entire exposed surface of the first part of the connecting element, such that the printed circuit board and the first parts of the at least one actuator connection and the connecting element are protected, such that a seal against external effects acting on the printed circuit board is obtained.

* * * * *